(12) United States Patent
Olivier et al.

(10) Patent No.: US 9,612,260 B2
(45) Date of Patent: Apr. 4, 2017

(54) METHOD AND SYSTEM FOR COUNTING SOCKET INSERTIONS OF ELECTRONIC INTEGRATED CIRCUITS

(71) Applicants: Andre Olivier, Chandler, AZ (US); Nicholas Olivier, Maricopa, AZ (US)

(72) Inventors: Andre Olivier, Chandler, AZ (US); Nicholas Olivier, Maricopa, AZ (US)

( * ) Notice: Subject to any disclaimer, the term of this patent is extended or adjusted under 35 U.S.C. 154(b) by 27 days.

(21) Appl. No.: 14/850,830

(22) Filed: Sep. 10, 2015

(65) Prior Publication Data

US 2016/0069931 A1    Mar. 10, 2016

Related U.S. Application Data

(60) Provisional application No. 62/048,718, filed on Sep. 10, 2014.

(51) Int. Cl.
*G08B 29/00* (2006.01)
*G01R 3/00* (2006.01)
*G01R 1/04* (2006.01)

(52) U.S. Cl.
CPC .............. *G01R 3/00* (2013.01); *G01R 1/0408* (2013.01)

(58) Field of Classification Search
CPC ...... G01R 3/00; G01R 1/0408; G01R 31/043; G08B 21/24; G06F 11/24
USPC .......... 340/514, 572.1, 572.4, 572.8
See application file for complete search history.

(56) References Cited

U.S. PATENT DOCUMENTS 6,181,144 B1 *  1/2001  Hembree ........... G01R 1/06744
                                                      324/537
2010/0312625 A1 * 12/2010  Miller .................... A63F 1/02
                                                      705/14.5

* cited by examiner

*Primary Examiner* — Tai Nguyen
(74) *Attorney, Agent, or Firm* — Schmeiser, Olsen & Watts LLP

(57) ABSTRACT

A method and electronic device for identifying when to replace/clean a probe card or socket are provided. The method includes receiving an ID of the probe card or socket from a tag associated with the probe card or socket before performing an insertion on a test system. For the received ID, there is determined a count of insertions performed on the probe card, and an indication to replace/clean the probe card or socket is generated when the count of insertions equals the threshold value.

20 Claims, 4 Drawing Sheets

__US 9,612,260 B2__

METHOD AND SYSTEM FOR COUNTING SOCKET INSERTIONS OF ELECTRONIC INTEGRATED CIRCUITS

CROSS-REFERENCE TO RELATED APPLICATION

This application claims priority to U.S. Provisional Patent Application No. 62/048,718 to Olivier et al. entitled "METHOD AND SYSTEM FOR COUNTING SOCKET INSERTIONS OF ELECTRONIC INTEGRATED CIRCUITS", filed Sep. 10, 2014, which application is incorporated herein by reference.

BACKGROUND

Technical Field

The present disclosure relates generally to test sockets for integrated circuit boards, and more particularly, to a method and system for identifying the number of times a socket has been exposed to insertions using dedicated short range communication such as RFID or bar codes to track the insertions.

State of the Art

The constant insertion and removal of devices into a socket or probe card causes the sockets to wear out over time. Worn out or dirty sockets fail and result in lost yields. While users of the devices know approximately how many insertions a socket can take, there is currently no reliable way to keep track of these insertions.

It would therefore be advantageous for an integrated circuit manufacturer to know ahead of time when a socket or probe card will wear out based on counted socket insertions to enable cleaning or replacement, before product yields are affected.

SUMMARY OF THE DISCLOSURE

In accordance with an aspect of the disclosure, there is provided a method and electronic device configured to implement the method, for identifying when to replace/clean a probe card or socket.

An embodiment may include a method for identifying when to replace/clean a probe card or socket. The method may comprise receiving an ID of the probe card or socket from a tag associated with the probe card or socket before performing an insertion on a test system; determining a count of insertions performed on the probe card for the received ID; and generating an indication to replace/clean the probe card or socket when the count of insertions equals a threshold value.

Another embodiment may include an electronic device comprising at least one processor and a non-volatile memory medium containing machine readable instructions. When the machine readable instructions are executed by the processor, they configure the electronic device to: receive an ID of a probe card or socket from a tag associated with the probe card or socket before performing an insertion on a test system; determine a count of insertions performed on the probe card or socket for the received ID; and generate an indication to replace/clean the probe card or socket when the count of insertions equals a threshold value.

Another embodiment may include an electronic device comprising at least one processor and a non-volatile memory medium containing machine readable instructions; a reader/writer, wherein the reader/writer receives an ID of a probe card or socket from a tag coupled to the probe card or socket before performing an insertion on a test system; and a contact counter for determining a count of insertions performed on the probe card or socket for the received ID, wherein the at least one processor executes machine readable instructions to generate an indication to replace/clean the probe card or socket when the count of insertions equals a threshold value.

The foregoing and other features and advantages of the present invention will be apparent from the following more detailed description of the particular embodiments of the invention, as illustrated in the accompanying drawings.

BRIEF DESCRIPTION OF THE DRAWINGS

The accompanying drawings, which are incorporated herein and constitute part of this specification, illustrate embodiments of the disclosure and together with the description, serve to explain the principles thereof. The embodiments illustrated herein are presently preferred, it being understood, however, that the disclosure is not limited to the precise arrangements and instrumentalities shown, wherein.

DETAILED DESCRIPTION OF THE PREFERRED EMBODIMENT(S)

Embodiments of the invention will be described with reference to the accompanying drawing figures wherein like numbers represent like elements throughout. Before embodiments of the invention are explained in detail, it is to be understood that the invention is not limited in its application to the details of the examples set forth in the following description or illustrated in the figures. The invention is capable of other embodiments and of being practiced or carried out in a variety of applications and in various ways. Also, it is to be understood that the phraseology and terminology used herein is for the purpose of description and should not be regarded as limiting. The use of "including," "comprising," or "having" and variations thereof herein are meant to encompass the items listed thereafter and equivalents thereof as well as additional items.

Figure 1:
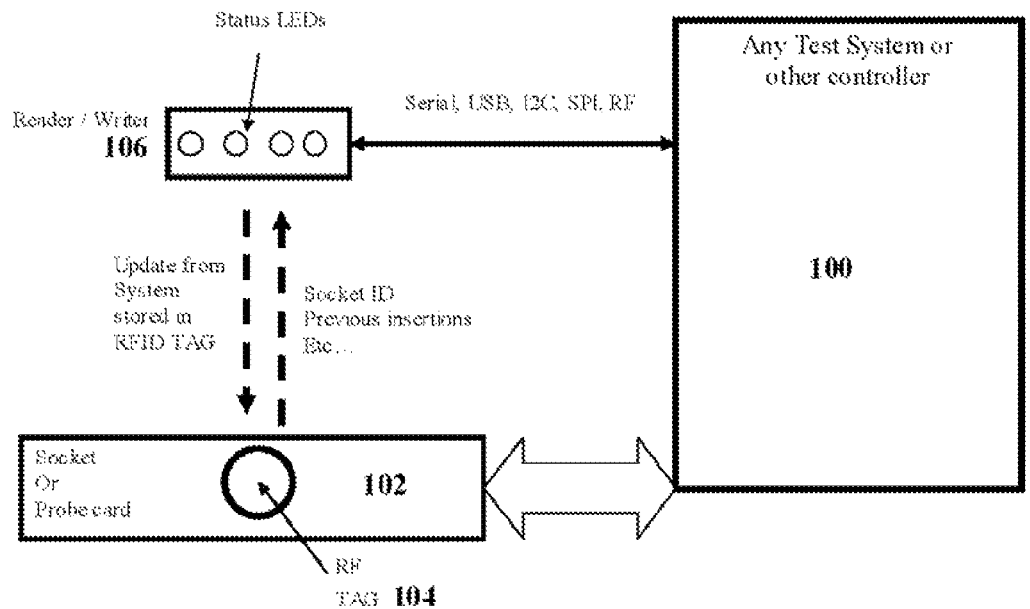
FIG. 1 is schematic of a system in accordance with an aspect of the invention that utilizes RFID tags.

Referring to FIG. 1, there is shown a schematic of a test socket system 100 comprising a test socket or probe card 102 that includes a radio frequency identifier (RFID) tag 104. The RFID tag 104 is disposed on the surface of the socket or probe card 102 or embedded therein. The RFID tag 104 is configured to communicate with a reader/writer 106 that functions as a bi-directional radio transmitter-receiver. The RFID tag 104 may be active, passive or battery-assisted passive of the types well-known in the art. The RFID tag 104 includes an integrated circuit for storing and processing information relating to the particular socket or probe card 102 with which it is associated. In this case shown in FIG. 1, the RFID tag 104 stores information relating to the ID of the socket or probe card 102. Optionally, the RFID tag 104 may store information corresponding to previous insertions of the socket or probe card 102. The information relating to socket or probe insertions is continuously updated by the reader/writer 106 as the socket or probe implements an insertion test in cooperation with test system/controller 100. The test system/controller 100 is of the type well known in the art for testing socket insertion and need not be discussed in detail herein. The reader/writer 106 is configured to transmit an encoded radio signal to interrogate the RFID tag 104. The RFID tag 104 then responds with identification of the socket or probe card 102 and optionally, any other information such as previous insertions. In this manner, when the socket or probe card 102 undergoes an insertion under the control of the test system/controller 100, the reader/writer 106 interrogates the RFID tag 104 to receive the current number of insertions to which the socket or probe card 102 has been exposed. At the same time, the information is updated on the RFID tag 104 by a write operation to reflect the last insertion performed. The ID of the socket or probe card 102 and number of insertions on the socket or probe card 102 may be communicated to the test system/controller 100 via any of a variety of communication protocols, including, but not limited to, serial, Universal Serial Bus (USB), Inter-Integrated Circuit (I2C), Serial Peripheral Interface (SPI), Radio Frequency (RF), and the like. The information may be presented on the test system/controller 100 in form of a count of the number of insertions, and/or a warning that a high number of insertions have previously been performed. The warning can be configured based upon a known number of insertions that are typically indicative of wear and suggesting socket or probe replacement. A plurality of status Light Emitting Diodes (LEDs) 110 can be provided on the reader/writer 106 or elsewhere to indicate the status of the socket or probe condition based on comparing the known number of insertions against the accrued number of insertions at any particular time. Since the ID and associated number of insertions are known for the socket or probe card 102 as stored in the RFID tag 104, the information can travel with the socket or probe card 102 and may be ascertained by another test system/controller 100 if the socket or probe card 102 is relocated for another test. The counting operation in this embodiment is implemented within the reader/writer 106 via software applications stored in memory and/or firmware executing on a processor within the reader/writer 106, and the reader/writer 106 may thereafter route the ID and count data to the test system 100. Furthermore, the reader/writer 106 may be implemented either as a stand-alone device, or as part of the test system/controller 100 in accordance with an aspect of the disclosure.

Figure 2:
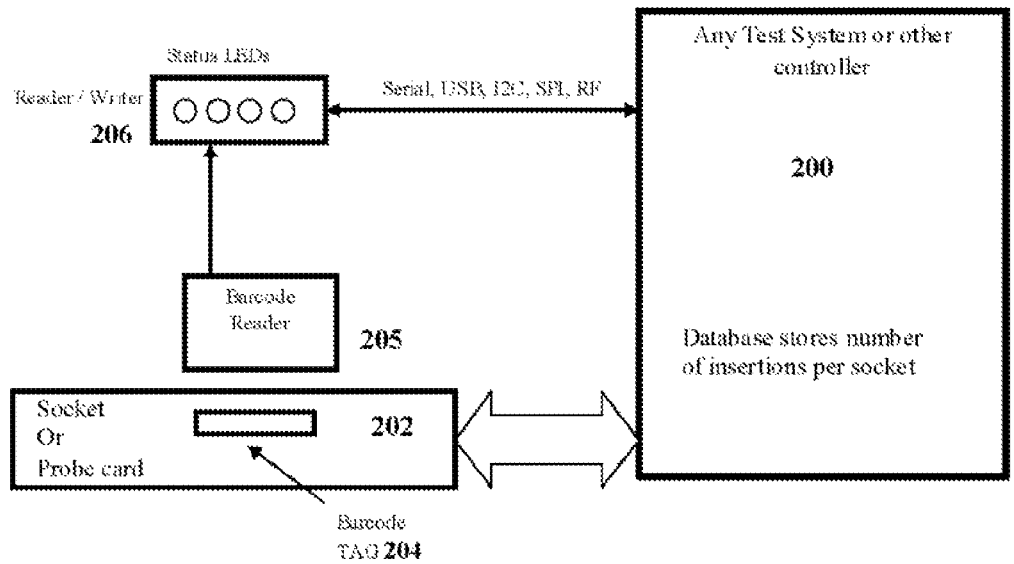
FIG. 2 is a schematic of a system in accordance with an aspect of the invention that utilizes barcodes.

FIG. 2 is a schematic of another embodiment in accordance with an aspect of the disclosure. In FIG. 2, a test socket system 200 comprises a test socket or probe card 202 that includes a barcode tag 204. The barcode tag 204 is disposed on the surface of the socket and is configured to be read by a barcode reader 205 that optically scans the barcode tag 204. The barcode tag 204 is a passive device of the type known in the art, which includes optical machine-readable data corresponding to an ID of the socket or probe card 202. In this embodiment, each time a socket or probe implements a test; the ID thereof is passed from the barcode reader 205 to the reader/writer 206. As the socket or probe card 202 undergoes a test under the control of test system/controller 200, the ID of the socket or probe card 202 is communicated to the test system/controller 200, which stores the number of insertions per socket ID in a database 209. As in the above-embodiment, the ID of the socket or probe card 102 may be communicated to the test system/controller 200 from the reader/writer 206 via any of a variety of communication protocols, including, but not limited to, serial, USB, I2C, SPI, RF, and the like. The information may be presented on the test system/controller 200 in form of a count of the number of insertions, and/or a warning that a high number of insertions have previously been performed. The warning can be configured based upon a known number of insertions that are typically indicative of wear and suggesting socket or probe replacement. A plurality of status Light Emitting Diodes (LEDs) 210 can be provided on the reader/writer 206 (or elsewhere) to indicate the status of the socket or probe condition based on comparing the known number of insertions against the accrued number of insertions at any particular time. While the database 209 is shown as part of the test system/controller 200, it is contemplated that the database 209 may be stored in a memory of the reader/writer 206. Alternatively, the reader/writer 206 may itself be incorporated into the test system/controller 200.

Figure 3:
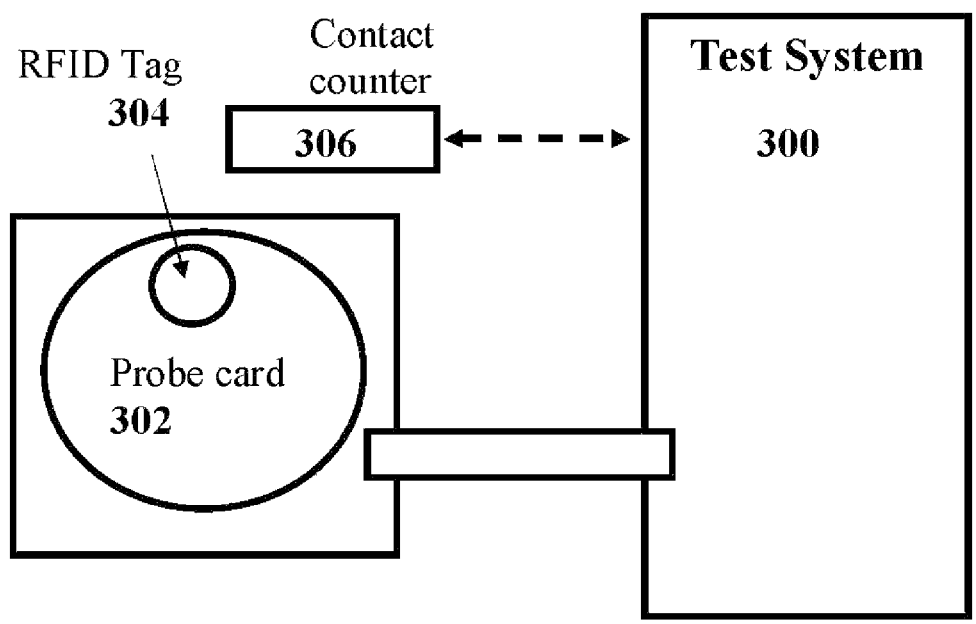
FIG. 3 is a schematic of an illustrative probe card with an RFID tag in accordance with an aspect of the invention.

FIG. 3 is a schematic of an illustrative test system 300 comprising a high-level flow in accordance with an aspect of the disclosure for a probe card 302. In FIG. 3, the probe card 302 is mounted on a test system 300 to test IC wafers. The probe card 302 has a RFID tag 304 on the printed circuit board which contains an ID and updated information regarding the number of insertions per the methodology described in the foregoing. The ID and number of insertions are processed by a Contact Counter 306 that in an exemplary embodiment is implemented in the reader/writer as described above. This information is communicated to the test system 300 via any of the protocols discussed with respect to FIGS. 1 and 2.

Figure 4:
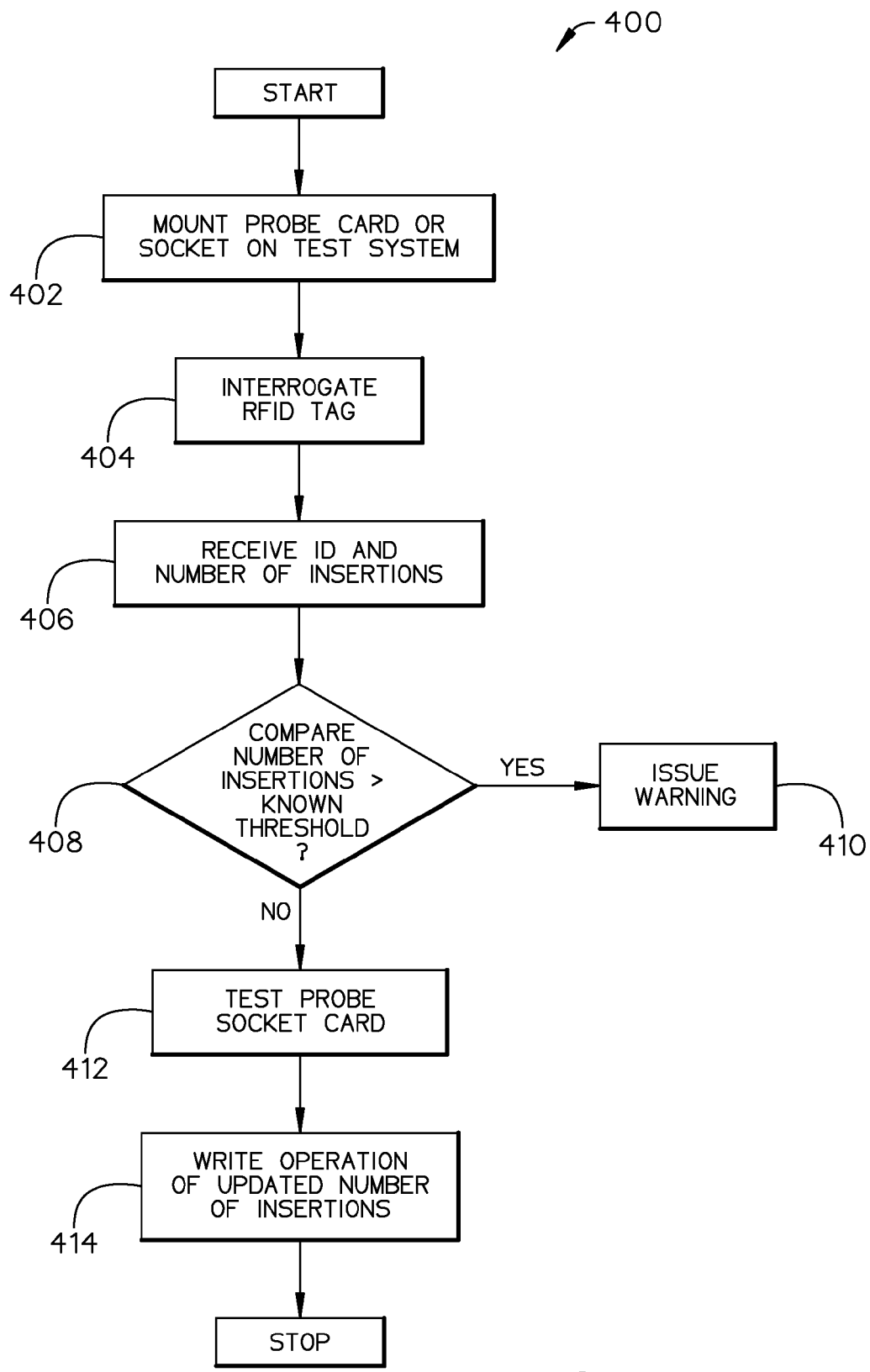
FIG. 4 is a flow diagram of a method in accordance with an aspect of the disclosure.

FIG. 4 is an illustrative flow diagram of a method 400 in accordance with an aspect of the disclosure. In block 402, a probe card or socket is mounted on a test system. In block 404, an RFID tag associated with the probe card or socket is interrogated by a reader/writer. In block 406, the reader writer receives data corresponding to the ID of the probe card or socket and number of previous insertions before an insertion test. At block 408, the number of insertions for the probe or socket is compared to a threshold value that indicates whether replacement is necessary. If the number of insertions exceeds the threshold, then a warning is generated at block 410 that the probe card or socket should be replaced. If the number of insertions does not exceed the threshold, then the process proceeds to block 412 and an insertion is performed. At block 414, a write operation is then performed that encodes the RFID tag with an updated number of insertions. In this manner, the probe card or socket has information as to the number of insertions associated therewith every time a test is performed. This can be read to inform an operator that a replacement is necessary when a preset threshold is exceeded before another insertion occurs that could potentially damage the probe card or socket based on known parameters.

Figure 5:
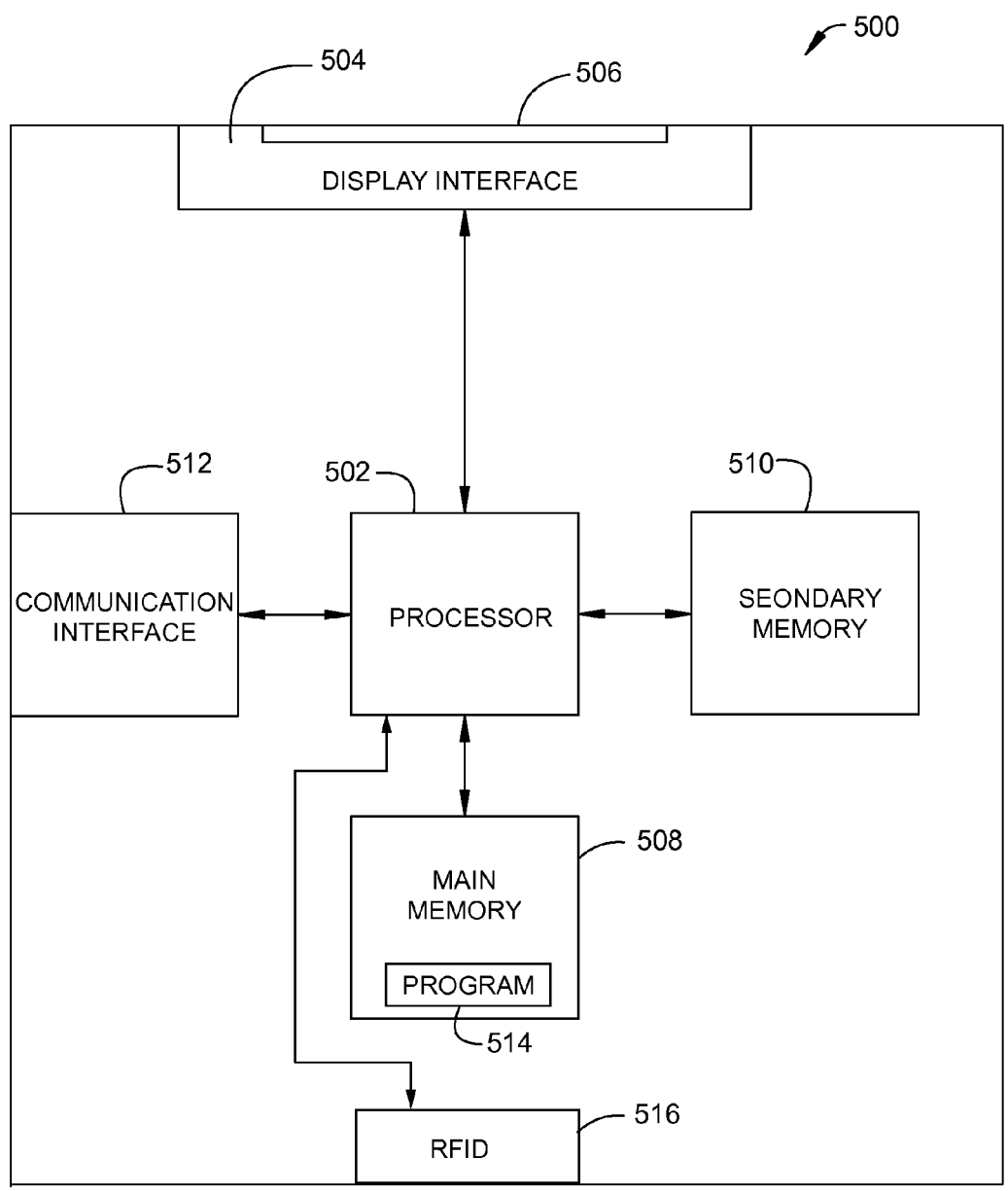
FIG. 5 is a schematic of an illustrative electronic device for carrying out aspects of the disclosure.

Referring now to FIG. 5, an electronic device 500 may be implemented as one or more computer systems capable of carrying out the functionality described herein. An exemplary computer system 500 includes one or more processors 502 connected to a communication infrastructure. The computer system 500 can include a display interface 504 that allows graphics, text, and other data from the communication infrastructure (or from a frame buffer) to be displayed on a display unit 506. The display unit 506 may comprise a touch-screen interface of the type well known in the art. The computer system also includes a main memory 508, preferably random access memory (RAM), and may also include a secondary memory 510. The secondary memory 510 may include, for example, a hard disk drive and/or a removable storage drive. The removable storage drive has read/write functionality onto removable storage media having stored therein computer software and/or data. In alternative embodiments, secondary memory may include other similar devices for allowing computer programs or other instructions to be loaded into computer system 500. Such devices may include, for example, a removable storage unit and an interface. The computer system may also include a communications interface 512 allowing software and data to be transferred between the computer system and external devices. Signals are provided to the communications interface via a communications path (e.g., channel). This path carries the signals and may be implemented using wire or cable, fiber optics, a telephone line, a cellular link, a radio frequency (RF) link and/or other communications channels. Computer programs 514 (also referred to as computer control logic) are stored in main memory and/or secondary memory. Computer programs may also be received via communications interface 512. Computer programs, when executed, enable the computer 500 to perform the features of the present disclosure, as discussed herein. Accordingly, such computer programs represent controllers of the computer system. In an embodiment where the disclosure is implemented using software, the software may be stored in a computer program product and loaded into computer system using the removable storage drive, hard drive, or communications interface. The control logic (software), when executed by the processor, causes the processor to perform the functions of the disclosure as described herein. In another embodiment, the disclosure may be implemented primarily in hardware using, for example, hardware components, such as application specific integrated circuits (ASICs). Implementation of the hardware state machine so as to perform the functions described herein will be apparent to persons skilled in the relevant art(s). The software may reside on a computer hard drive, database or other repository of data, or be uploaded from the Internet or other network (e.g., from a PC, minicomputer, mainframe computer, microcomputer, telephone device, PDA, or other network access device having a processor and input and/or output capability). Any available software tool capable of implementing the concepts described herein may be used to implement the system and method of the present disclosure. The method and system of the present disclosure may also be implemented as an application-specific add-on to a program, or as a standalone application. The electronic device logically couples a RFID reader/writer to the processor 502 for interrogating an RFID tag associated with a probe card or socket as described above to both transfer count information to the RFID tag, and to receive count and ID information from the ID tag.

The present disclosure has been shown and described in what are considered to be the most practical and preferred embodiments. Having thus described the disclosure of the present application in detail and by reference to embodiments thereof, it will be apparent that modifications and variations are possible and without departing from the scope of the invention defined in the appended claims as follows.

The invention claimed is:

1. A method for identifying when to replace/clean a probe card or socket, comprising:
   receiving an ID of the probe card or socket from a tag associated with the probe card or socket before performing an insertion on a test system;
   determining a count of insertions performed on the probe card for the received ID; and
   generating an indication to replace/clean the probe card or socket when the count of insertions equals a threshold value.

2. The method of claim 1, wherein the step of receiving the ID comprises interrogating an RFID tag associated with the probe card or socket.

3. The method of claim 1, wherein the step of receiving the ID comprises scanning a barcode associated with the probe or socket.

4. The method of claim 2, wherein the step of determining the count of insertions performed on the probe card or socket comprises interrogating the RFID tag.

5. The method of claim 4, further comprising updating the count of insertions to the RFID tag after performing an insertion on the test system.

6. The method of claim 3, further comprising updating the count of insertions after performing an insertion on the test system.

7. An electronic device comprising at least one processor and a non-volatile memory medium containing machine readable instructions which, when executed by the processor, configure the electronic device to:
   receive an ID of a probe card or socket from a tag associated with the probe card or socket before performing an insertion on a test system;
   determine a count of insertions performed on the probe card or socket for the received ID; and
   generate an indication to replace/clean the probe card or socket when the count of insertions equals a threshold value.

8. The electronic device of claim 7, wherein receiving the ID comprises interrogating an RFID tag associated with the probe card or socket.

9. The electronic device of claim 7, wherein receiving the ID comprises scanning a barcode associated with the probe card or socket.

10. The electronic device of claim 8, wherein determining the count of insertions performed on the probe card or socket comprises interrogating the RFID tag.

11. The electronic device of claim 10, further comprising updating the count of insertions to the RFID tag after performing an insertion on the test system.

12. The electronic device of claim 9, further comprising updating the count of insertions after performing an insertion on the test system.

13. An electronic device comprising:
   at least one processor and a non-volatile memory medium containing machine readable instructions;
   a reader/writer, wherein the reader/writer receives an ID of a probe card or socket from a tag coupled to the probe card or socket before performing an insertion on a test system; and
   a contact counter for determining a count of insertions performed on the probe card or socket for the received ID, wherein the at least one processor executes machine readable instructions to generate an indication to replace/clean the probe card or socket when the count of insertions equals a threshold value.

14. The electronic device of claim 13, wherein the tag coupled to the probe card or socket is an RFID tag and the reader/writer interrogates the RFID tag to receive the ID.

15. The electronic device of claim 13, wherein the tag coupled to the probe card or socket is a barcode and the reader/writer scans the barcode to receive the ID.

16. The electronic device of claim 14, wherein the contact counter determines the count of insertions performed on the probe card or socket by interrogating the RFID tag.

17. The electronic device of claim 16, wherein the contact counter updates the count of insertions to the RFID tag after an insertion of the probe card or socket on the test system is performed.

18. The electronic device of claim 15, wherein the contact counter determines the count of insertions performed on the probe card or socket by scanning the barcode.

19. The electronic device of claim 18, wherein the contact counter updates the count of insertions to the barcode after an insertion of the probe card or socket on the test system is performed.

20. The electronic device of claim 13, further comprising a display unit, wherein the indication to replace/clean the probe card or socket is displayed on the display unit.

\* \* \* \* \*